(12) United States Patent
Wu et al.

(10) Patent No.: US 8,736,845 B2
(45) Date of Patent: May 27, 2014

(54) FREQUENCY STABILIZED LASER SYSTEM

(75) Inventors: Jianfeng Wu, Tucson, AZ (US);
Jennifer S. Strabley, Maple Grove, MN (US); Tiequn Qiu, Glendale, AZ (US);
Glen A. Sanders, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 237 days.

(21) Appl. No.: 13/457,929

(22) Filed: Apr. 27, 2012

(65) Prior Publication Data
US 2012/0300198 A1 Nov. 29, 2012

Related U.S. Application Data

(60) Provisional application No. 61/489,659, filed on May 24, 2011.

(51) Int. Cl.
*G01C 19/72* (2006.01)
*G01B 11/16* (2006.01)

(52) U.S. Cl.
USPC ............................................ 356/461; 372/32

(58) Field of Classification Search
USPC .................... 356/460, 461; 372/29.02, 32
See application file for complete search history.

(56) References Cited

U.S. PATENT DOCUMENTS

| | | | |
|---|---|---|---|
| 5,394,242 A * | 2/1995 | Porter | ........................... 356/461 |
| 6,134,006 A | 10/2000 | Telschow et al. | |
| 6,175,411 B1 | 1/2001 | Telschow et al. | |
| 6,853,479 B1 | 2/2005 | Ilchenko et al. | |
| 6,879,752 B1 | 4/2005 | Ilchenko et al. | |
| 6,928,091 B1 | 8/2005 | Maleki et al. | |
| 7,061,335 B2 | 6/2006 | Maleki et al. | |
| 7,062,131 B2 | 6/2006 | Ilchenko | |
| 7,133,180 B2 | 11/2006 | Ilchenko et al. | |
| 7,184,451 B2 | 2/2007 | Ilchenko et al. | |
| 7,187,870 B2 | 3/2007 | Ilchenko et al. | |
| 7,218,662 B1 | 5/2007 | Ilchenko et al. | |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |

(Continued)

OTHER PUBLICATIONS

Farr et al., "Hybrid optical and electronic laser locking using spectral hole burning", Aug. 2, 2010, pp. 14, Department of Physics at University of Otago, available at http://arxiv.org/PS_cache/arxiv/pdf/1008/1008.0229v1.pdf.

(Continued)

*Primary Examiner* — Michael A Lyons
(74) *Attorney, Agent, or Firm* — Fogg & Powers LLC

(57) ABSTRACT

A laser stabilization system includes laser source having first and second ends; first waveguide portion having first and second ends, first end of first waveguide portion coupled to first end of laser source; second waveguide portion having first and second ends, first end of second waveguide portion coupled to second end of laser source; micro-cavity coupled between second end of first waveguide portion and second end of second waveguide portion, micro-cavity having resonant frequency; and electronic locking loop coupled between micro-cavity and laser source, wherein electronic locking loop electronically locks laser source to resonant frequency of micro-cavity; wherein first waveguide portion is optical locking loop coupled between micro-cavity and laser source, wherein optical locking loop optically locks laser source to resonant frequency of micro-cavity; micro-cavity stabilization loop coupled with micro-cavity, wherein micro-cavity stabilization loop stabilizes resonant frequency of micro-cavity to reference frequency; and output for outputting light from system.

20 Claims, 3 Drawing Sheets

(56) References Cited

U.S. PATENT DOCUMENTS

| | | | |
|---|---|---|---|
| 7,356,214 | B2 | 4/2008 | Ilchenko |
| 7,362,927 | B1 | 4/2008 | Ilchenko et al. |
| 7,369,722 | B2 | 5/2008 | Yilmaz et al. |
| 7,389,053 | B1 | 6/2008 | Ilchenko et al. |
| 7,400,796 | B1 | 7/2008 | Kossakovski et al. |
| 7,460,746 | B2 | 12/2008 | Maleki et al. |
| 7,480,425 | B2 | 1/2009 | Gunn et al. |
| 7,535,576 | B2 * | 5/2009 | Keyser et al. ............. 356/461 |
| 7,587,144 | B2 | 9/2009 | Ilchenko et al. |
| 7,634,201 | B2 | 12/2009 | Maleki et al. |
| 7,801,189 | B2 | 9/2010 | Maleki et al. |
| 7,813,651 | B2 | 10/2010 | Ilchenko et al. |
| 7,869,472 | B2 | 1/2011 | Maleki et al. |
| 7,929,589 | B1 | 4/2011 | Ilchenko et al. |
| 7,965,745 | B2 | 6/2011 | Maleki et al. |
| 7,991,025 | B2 | 8/2011 | Maleki et al. |
| 8,331,409 | B1 * | 12/2012 | Liang et al. ............. 372/32 |
| 2008/0075464 | A1 | 3/2008 | Maleki et al. |
| 2009/0324251 | A1 | 12/2009 | Ilchenko et al. |
| 2010/0118375 | A1 | 5/2010 | Maleki et al. |
| 2011/0064415 | A1 | 3/2011 | Williams et al. |
| 2011/0097078 | A1 | 4/2011 | Eliyahu et al. |
| 2011/0110387 | A1 | 5/2011 | Maleki et al. |
| 2011/0150485 | A1 | 6/2011 | Seidel et al. |
| 2011/0255094 | A1 | 10/2011 | Mohageg et al. |

OTHER PUBLICATIONS

"Lasers for Sensing: WGM microresonator narrows laser-diode linewidth to 200 Hz", accessed on May 24, 2011, pp. 12, Publisher: Laser Focus World, http://www.optoiq.com/index/photonics-technologies-applications/lfw-display/lfw-article-display/4783416636/articles/laser-focus-world/volume-47/issue-4/world-news/lasers-for-sensing-wgm-microresonator-narrows-laser-diode-linewidth-to-200-hz.html.

"Adjustable linewidth laser simplifies, reduces testing costs", accessed May 24, 2011, p. 1, available at http://www.optoiq.com/index/photonics-technologies-applications/lfw-display/lfw-article-display/0559541391/articles/laser-focus-world/volume-46/issue-8/newsbreaks/adjustable-linewidth.html.

"Narrow-Linewidth Lasers: Small resonator-stabalized laser has 13kHz linewidth", accessed May 24, 2011, pp. 1-3, available at http://www.optoiq.com/index/photonics-technologies-applications/lfw-display/lfw-article-display/8748195005/articles/optoiq2/photonics-technologies/technology-products/lasers-_sources/2010/11/narrow-linewidth-lasers-small-resonator-stabilized-laser-has-13-khz-linewidth.html.

Liang et al., "Whispering gallery mode resonator based ultra-narrow linewidth external cavity semiconductor laser", Aug. 5, 2010, pp. 113, available at http://arxiv.org/PS_cache/arxiv/pdf/1008/1008.0896v1.pdf.

Liang et al., "Whispering-gallery-mode-resonator-based ultranarrow linewidth external-cavity semiconductor laser", "Optics Letters", Aug. 15, 2010, pp. 2822-2824, vol. 35, No. 16, available at http://www.opticsinfobase.org/ol/abstract.cfm?uri=ol-35-16-2822.

McRae et al, "Thermo-optic locking of a semiconductor laser to a microcavity resonance", accessed Dec. 15, 2011, 2009, pp. 16, available at http://arxiv.org/ftp/arxiv/papers/0909/0909.1120.pdf.

"Preliminary product brief Ultra-Narrow Linewidth Laser source", Feb. 28, 2011, pp. 12, Publisher: OEwaves, available at http://www.oewaves.com/downloads/NLWL%20PB03_11_11.pdf.

"OEwaves Introduces Revolutionary Narrow Linewidth Laser Source", Jan. 20, 2011, p. 1, Publisher: OEwaves, available at http://www.oewaves.com/userfiles/file/NLWL%20PR%20011911.pdf.

* cited by examiner

FREQUENCY STABILIZED LASER SYSTEM

CROSS-REFERENCE TO RELATED APPLICATIONS

This application claims the benefit of priority to U.S. Provisional Application No. 61/489,659, filed on May 24, 2011, the disclosure of which is incorporated herein by reference.

BACKGROUND

While larger laser technology can provide a laser source with a line-width of a few Hertz (Hz), the large physical size and high power consumption of larger laser systems make these systems unacceptable for many commercial applications, such as laser gyroscopes, atomic clocks, and distributed fiber optical sensing.

While some laser technology employs micro-cavities as wavelength selection filters to reduce the laser line-width, the line-width of many micro-cavities is quite large due to large free spectral range (FSR) of the micro-cavities.

SUMMARY

A laser stabilization system includes a laser source having a first end and a second end; a first waveguide portion having a first end and a second end, the first end of the first waveguide portion coupled to the first end of the laser source; a second waveguide portion having a first end and a second end, the first end of the second waveguide portion coupled to the second end of the laser source; a micro-cavity coupled between the second end of the first waveguide portion and the second end of the second waveguide portion, the micro-cavity having a resonant frequency; and an electronic locking loop coupled between the micro-cavity and the laser source, wherein the electronic locking loop electronically locks the laser source to the resonant frequency of micro-cavity; wherein the first waveguide portion is an optical locking loop coupled between the micro-cavity and the laser source, wherein the optical locking loop optically locks the laser source to the resonant frequency of the micro-cavity; a micro-cavity stabilization loop coupled with the micro-cavity, wherein the micro-cavity stabilization loop stabilizes the resonant frequency of the micro-cavity to a reference frequency; and an output for outputting light from the laser stabilization system.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
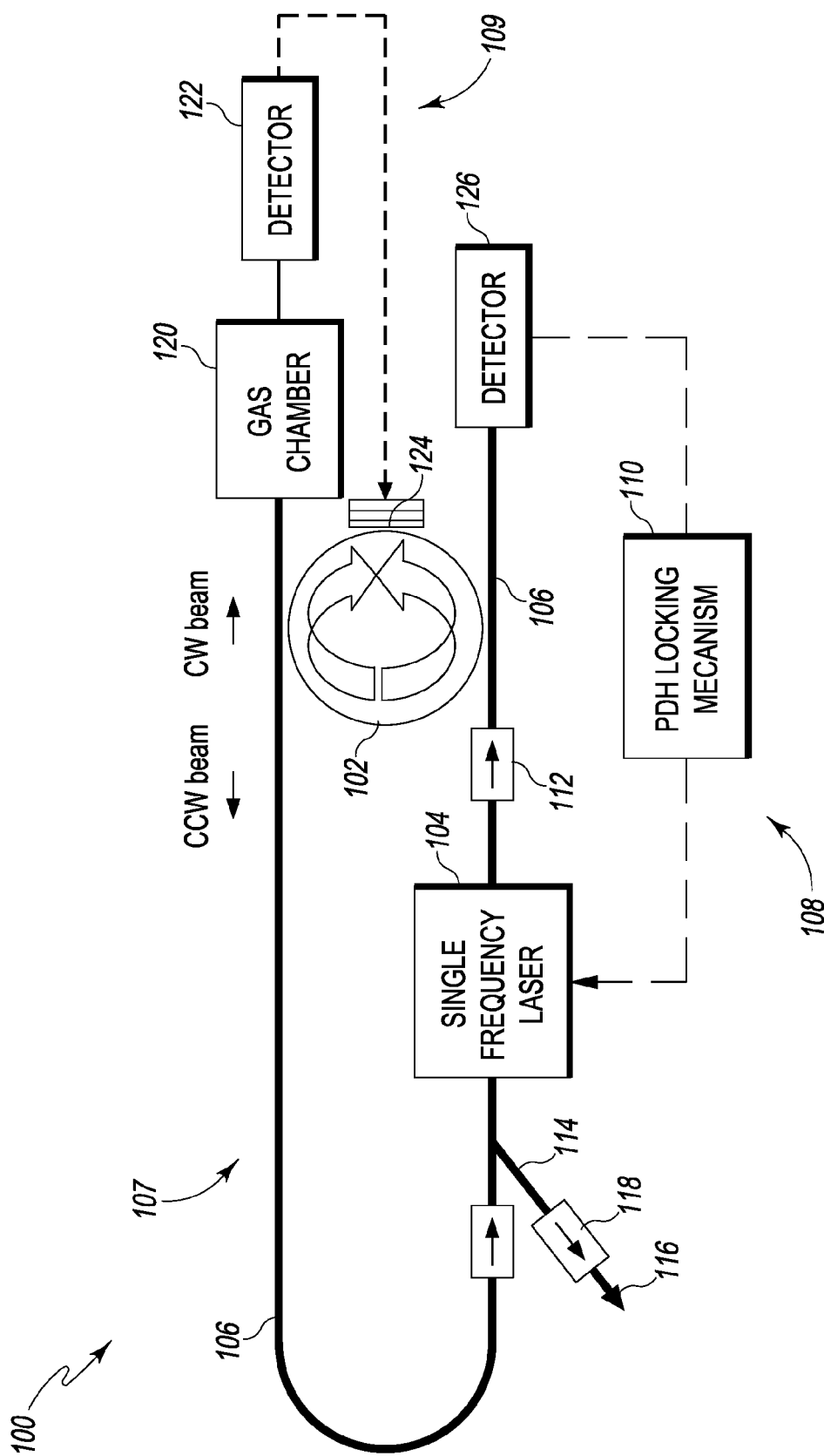
FIG. 1 is a block diagram of a frequency stabilized laser system according to the present invention.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

This description is directed to frequency stabilized laser systems with micro-cavities, including wafer-level narrow line-width heterogeneous single frequency lasers. In some implementations, these frequency stabilized laser systems are manufactured on Complementary Metal Oxide Semiconductor (CMOS) compatible Silicon substrates or other appropriate substrate materials. In some implementations, these frequency stabilized laser systems are used in laser gyroscopes, atomic clocks, distributed fiber optical sensing, and other commercial optical sensing applications.

In some embodiments, a stable reference cavity with very narrow line-width is included. The finesse of the cavity needs to be extremely high to reach the line-width of the cavity to the level of 100 KHz. Micro-cavities based on whispering-gallery-modes (WGMs) can provide high stand alone quality factors (Q factors). When micro-cavities are used as wavelength selection components and optical power transfer tools, the high Q factor is reduced by the high coupling loss between a waveguide and a micro-cavity. The coupling loss may cause an increase in the line-width of the micro-cavity.

FIG. 1 is a block diagram of a laser stabilization system 100 (also referred to as a micro-cavity frequency stabilized laser system) according to the present invention. In exemplary embodiments, system 100 is a frequency stabilized laser system that stabilizes the frequency of a laser. The system 100 is stabilized by two separate locking loops. Specifically, the system 100 uses both self-injection optical locking and Pound-Drever-Hall (PDH) electronic feedback locking to stabilize a laser diode to a whispering-gallery-mode (WGM) of a passive micro-cavity.

A PDH locking loop 108 is used to lock a laser source, such as single frequency laser 104, to a predetermined frequency. Specifically, the PDH locking loop 108 will be used to control the laser line-width at Hz level. In some implementations, the heterogeneous design on the Silicon chip makes it compatible with CMOS electronics. Thus, the system 100 includes a CMOS compatible heterogeneous ultra narrow line-width semiconductor laser (such as single frequency laser 104) on one small Silicon on Insulator (SOI) chip. In the embodiment shown in FIG. 1, a large size micro-cavity 102 (such as a micro-disk, a micro-ring, or other suitable micro-cavity) is used as a reference cavity to stabilize a single frequency laser 104, such as a multi-electrode (distributed-feedback) DFB laser. In other embodiments, other laser sources are used instead of a single frequency laser 104. While large size micro-cavities are preferred for micro-cavity 102 because it is easier to manufacture a higher Q micro-cavity when it has a larger cavity size, other implementations use a smaller size micro-cavity for micro-cavity 102. The micro-cavity 102 will be used as a reference cavity to provide a reflection signal that can be used as a Pound-Drever-Hall locking signal. In some implementations, most of the laser power will emit from a Y-coupler (such as Y-coupler 114) before the reference cavity (micro-cavity 102). Only a small portion of the laser will be used to be locked to the passive reference micro-cavity 102, therefore the reference cavity (micro-cavity 102) won't get disturbed by high power inside of the cavity.

In system 100 shown in FIG. 1, the micro-cavity 102 is a large size micro-cavity, such as greater than 400 microns. In some implementations, the large size of the micro-cavity 102 enables a Q factor at the level of approximately 10^7 (approximately 10 million) or 10^9 (approximately 1 billion). Such a high Q value results in a micro-cavity 102 with a line-width of approximately 100-200 KHz. In order to maintain the high Q factor of the micro-cavity 102, a coupling waveguide 106 is positioned to be not too close to the micro-cavity 102. While the waveguide 106 is used in the implementation of system 100 shown in FIG. 1, other implementations use a fiber in place of the waveguide 106.

When the critical coupling condition is reached, the transmission port of the waveguide 106 (which may also be considered as a reflection port from the micro-cavity in PDH locking theory) will see a sharp dip. The sharp dip results from a line-width of approximately 100 KHz or even lower. The sharp dip can be used as a discriminant for a Pound-Drever-Hall (PDH) locking mechanism 110. The refractive index of reference cavity, as well as the resonance frequency, can be actively controlled by an injection-current induced electro-optical effect. Both the fast control loop (optical phase modulation in the self-injection locking loop 107) and slow control loop (electronic direct current modulation in the PDH locking loop 108) are used to stabilize the laser frequency. In some embodiments, a third stabilization loop, such as a micro-ring stabilization loop 109, is used to stabilize the resonant frequency of a high Q micro-cavity, such as micro-cavity 102.

A waveguide based phase modulator will be used to modulate the phase at a high frequency region for PDH locking loop 108. In the implementation shown in FIG. 1, the phase modulator is incorporated into the single frequency laser 104. Direct current modulation of the laser (by the PDH locking loop 108) will be used to tune the laser at low speed. A waveguide based optical isolator 112 is used to block the backward laser. Y-coupler 114 will be used to separate the main laser beam emitted from the system 100 from output 116 and the reference laser beam which will be used for PDH locking loop 108. The waveguide based optical isolator 118 is used to block any light coming from output 116 into the system 100. In exemplary embodiments, the waveguide based optical isolator 118 is part of a circulator. In the system 100, a large size micro-cavity 102 (such as micro-disk, micro-ring) is fabricated near the waveguide that is used to propagate the laser beam used for PDH locking loop. In some implementations, the micro-cavity has a Q factor greater than 10^9 and a line-width of less than 200 KHz. In some implementation, the coupling efficiency between the waveguide and the micro-cavity can be adjusted in order to reach the critical coupling condition.

In some implementations, the refractive index of the micro-cavity can be adjusted by injection current induced electro-optical effect based on feedback from any change in intensity of the clockwise beam that enters a gas chamber 120. The change in intensity is indicative of a change in the resonant frequency of the micro-cavity 102. The change in intensity is detected by a photo detector 122 (or other appropriate detector) and this information is used to control a phase modulator 124, such as a thermal phase modulator, to correct the resonant frequency.

The self-injection locking loop 107 is used to lock the laser source, such as single frequency laser 104, to a predetermined frequency. Specifically, a self-injection optical feedback signal comes from a transmitted CCW beam after the micro-cavity 102 (or high Q micro-ring cavity) in the self-injection locking loop 107. The feedback beam has a very narrow line-width and low noise at high Fourier frequency due to high Q micro-cavity filter effect. The self-injection optical feedback provided by the self-injection locking loop 107 helps to reduce the DFB laser line-width by tens of decibels (dB). The self-injection optical feedback provided by the self-injection locking loop 107 forces the laser frequency to follow (or lock to) the micro-cavity 102 resonant frequency and helps to make the PDH locking loop 108 more stable.

A standard single frequency semiconductor laser (such as single frequency laser 104) exhibits high phase noise due to its low Q cavity and strong coupling between phase and amplitude of the electric field. Self-injection optical feedback can be used to lock the laser to the micro-cavity 102 (or stable micro-ring reference cavity). In addition, a PDH locking technique is used to achieve a tighter and more stable locking in the PDH locking loop 108. The PDH locking loop 108 has a high sensitivity of frequency stabilization by exploring a very high modulation frequency region. Another clockwise laser beam from the micro-cavity 102 is used for absorption line measurement. A phase modulator 124, such as a thermal phase modulator, on the micro-cavity 102 is used to adjust the optical path of the micro-cavity based on the error signal from absorption line measurement.

The micro-cavity 102 serves as the reference cavity for diode laser stabilization in the system 100. In some implementations, the micro-cavity 102 is a highly stable passive micro-ring cavity with high quality factor (Q). In some implementations, the micro-cavity 102 used as the stable reference cavity is a silicon nitride high Q micro-ring as a stable reference cavity in this heterogeneous laser approach. In some implementations, a monolithic design is used to reduce the micro-cavity 102's sensitivity to acoustic vibration. The thermo-optic coefficient (TOC) of silicon nitride ($Si_3N_4$) is at the same level of $SiO_2$ ($1*10^{-5}$) and is one order of magnitude lower than the TOC of silicon ($2.3*10^{-4}$). The thermal stability of the reference cavity is improved by using silicon nitride, but is still thermally noisy compared with a vacuum cavity. Thus, negative feedback control is necessary to make it thermally stable.

In exemplary embodiments having a micro-ring stabilization loop 109, a molecule absorption line is used as reference to stabilize the micro-cavity 102 against thermal noise. As shown in FIG. 1, a clockwise laser beam from the micro-cavity 102 (such as a micro-ring) is used for absorption line measurement. A phase modulator 124 (such as a thermal phase modulator) on the micro-cavity 102 is used to adjust the optical path based on the error signal from absorption line measurement.

A self-injection locking mechanism (such as the self-injection locking loop 107) is used to lock the laser frequency of the single frequency laser 104 to the micro-cavity 102's resonant frequency. The high sensitivity of laser diodes, such as the single frequency laser 104, to external electric field noise can result in a high level of phase noise spectrum, but it also makes it possible to use a weak external optical feedback to modify the lasing characteristics of the laser diode (such as the single frequency laser 104). The self-injection locking loop 107 (or other optical feedback loop) can force the DFB laser (single frequency laser 104) to follow the resonator frequency of the reference cavity (micro-cavity 102), and make it easier for the PDH locking loop 108 (or other electronic locking loop) to lock. A slow phase modulator in the optical feedback loop (self-injection locking loop 107) helps to maintain the stable locking to the resonant peak of the micro-cavity 102. The high Q reference cavity (micro-cavity 102) also helps to reduce the diode laser line-width by a few orders of magnitude. According to the self-injection locking theory, the final line-width reduction is proportional to the fraction of injection power and the ratio of cavity line-width between the DFB laser cavity (single frequency laser 104) and reference cavity (micro-cavity 102). As shown in FIG. 1, the optical feedback signal is a counter-clock-wise (CCW) transmitted laser beam from micro-ring (micro-cavity 102). The micro-cavity 102 also acts as an optical filter to filter both relative intensity noise (RIN) and phase noise at frequency components that are higher than its line-width.

In some implementations, the single frequency laser 104 is a single frequency semiconductor laser with slow and fast phase modulator. The single frequency laser 104 has a flat frequency modulation (FM) response up to a few hundred MHz.

The Pound-Drever-Hall (PDH) locking technique used in the PDH locking loop 108 has a high sensitivity of frequency stabilization by exploring a very high modulation frequency region. Using a multi-electrode DFB laser as the single frequency laser 104 provides a wide bandwidth flat frequency modulation (FM) response to the laser diode. The frequency modulation speed of a multi-electrode DFB laser can reach a few hundreds of MHz level and improves the PDH locking sensitivity in the PDH locking loop 108. In the PDH locking loop 108, the carrier beam from the right facet (HR facet) of the DFB laser (single frequency laser 104) is coupled to the micro-cavity 102 (or micro-ring reference cavity), while the modulation sidebands being outside the resonance are directly transmitted to a photo detector 126. The phase of the received sinusoidal signal is then compared with that of the reference RF sinusoidal which gives an error signal for the electrical feedback loop (PDH locking loop 108).

In some applications, such as for gyro applications, the laser frequency of the system 100 must be tunable in order to be resonant with a gyro resonator under different rotation direction. The frequency of proposed heterogeneous single frequency laser 104 can be tuned by locking the PDH error signal of the PDH locking loop 108 at different direct current (DC) levels. If a wider tuning range is desired, a larger frequency shift can be achieved by tuning the phase modulator 124 (such as a thermal phase modulator) attached onto the micro-cavity 102. In some implementations, the phase modulator 124 (such as a thermal phase modulator) is used for micro-cavity 102 stabilization as well. With an additional external modulation signal, the cavity resonant frequency can be tuned at a few KHz speed.

Figure 2:
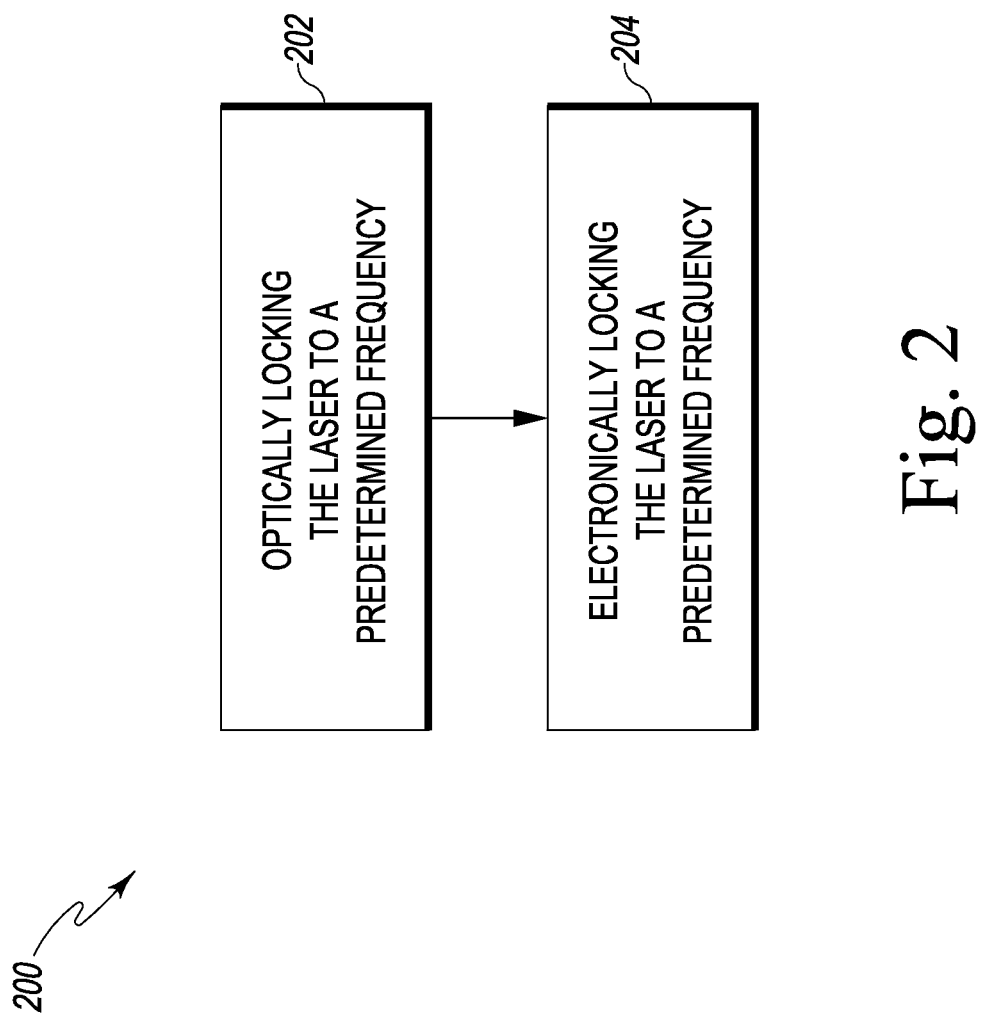
FIG. 2 is a flow chart illustrating a method 200 of stabilizing a laser according to the present invention.

FIG. 2 is a flow chart illustrating a method 200 of stabilizing a laser according to the present invention. The method 200 begins at 202 where the laser is optically locked to a predetermined frequency. The method 200 next proceeds to 204 where the laser is electronically locked to the predetermined frequency. In other embodiments, additional steps are also taken to stabilize the laser. For example, exemplary embodiments having a micro-ring stabilization loop 109 modulate the phase of the micro-cavity 102 in response to a resonant frequency change in the micro-cavity 102. In exemplary embodiments, a phase modulator 124 (such as a thermal phase modulator) is used to modulate the phase of the micro-cavity 102 in response to a resonant frequency change in the micro-cavity 102.

Figure 3:
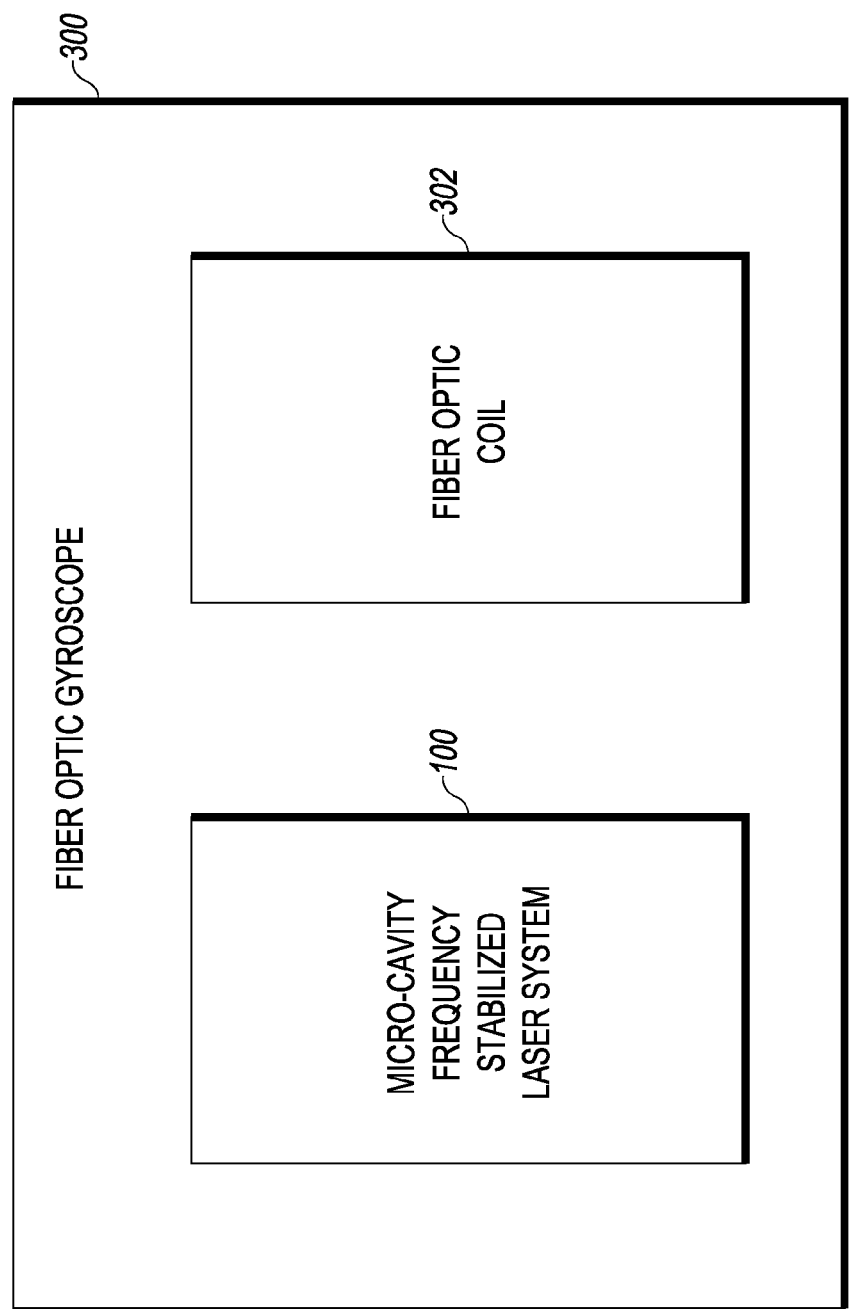
FIG. 3 is a block diagram of a fiber optic gyroscope utilizing the frequency stabilized laser system shown in FIG. 1 according to the present invention.

FIG. 3 is a block diagram of a fiber optic gyroscope 300 utilizing the frequency stabilized laser system 100 shown in FIG. 1 according to the present invention. The fiber optic gyroscope includes at least one micro-cavity frequency stabilized laser system, such as system 100, and a fiber optic coil 302. In addition to the system 100 and the fiber optic coil 302, the fiber optic gyroscope may also include a processing unit that includes or functions with software programs, firmware or other computer readable instructions for carrying out various methods, process tasks, calculations, and control functions, used in the fiber optic gyroscope 300.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

In exemplary embodiments, a frequency stabilized laser system includes a multi-electrode DFB laser source, a high Q micro-cavity, a waveguide/fiber, a circulator, a master output, optical isolators, a receiver (such as a photo detector), a PDH locking servo loop, a gas chamber and detector, and a thermal phase modulator. The multi-electrode DFB laser source is stabilized by two separate locking loops. First, a self-injection locking loop is used to lock the multi-electrode DFB laser source to a predetermined frequency. Second, a PDH locking servo loop is used to lock the multi-electrode DFB laser source to the predetermined frequency. In addition, a third micro-ring stabilization loop is used to stabilize the resonant frequency of the high Q micro-cavity.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Example Embodiments

Example 1 includes a laser stabilization system comprising a laser source having a first end and a second end; a first waveguide portion having a first end and a second end, the first end of the first waveguide portion coupled to the first end of the laser source; a second waveguide portion having a first end and a second end, the first end of the second waveguide portion coupled to the second end of the laser source; a micro-cavity coupled between the second end of the first waveguide portion and the second end of the second waveguide portion, the micro-cavity having a resonant frequency; an electronic locking loop coupled between the micro-cavity and the laser source, wherein the electronic locking loop electronically locks the laser source to the resonant frequency of the micro-cavity; wherein the first waveguide portion is an optical locking loop coupled between the micro-cavity and the laser source, wherein the optical locking loop optically locks the laser source to the resonant frequency of the micro-cavity; a micro-cavity stabilization loop coupled with the micro-cavity, wherein the micro-cavity stabilization loop stabilizes the resonant frequency of the micro-cavity to a reference frequency; and an output for outputting light from the laser stabilization system.

Example 2 includes the system of Example 1, wherein the micro-cavity stabilization loop includes a thermal phase modulator coupled to the micro-cavity, wherein the thermal phase modulator receives a feedback signal that varies based on an absorption line measurement of a laser beam emitted from the micro-cavity through a gas chamber.

Example 3 includes the system of Example 2, wherein the micro-cavity stabilization loop further includes a gas chamber having an absorption line coupled to the micro-cavity; and a photo detector coupled to the gas chamber; wherein the photo detector measures the intensity of the laser beam emitted from the micro-cavity after it passes through the gas chamber; wherein the feedback signal varies based on the intensity; and wherein change in the intensity is indicative of a change in the resonant frequency of the micro-cavity.

Example 4 includes the system of any of Examples 1-3, wherein the micro-cavity stabilization loop thermally stabilizes the micro-cavity against thermal noise.

Example 5 includes the system of any of Examples 1-4, wherein the laser source is a single frequency laser.

Example 6 includes the system of any of Examples 1-5, wherein the laser source is a multi-electrode distributed-feedback laser.

Example 7 includes the system of any of Examples 1-6, wherein the micro-cavity is a passive micro-ring cavity with a quality factor (Q) of above approximately $10^7$.

Example 8 includes the system of any of Examples 1-7, wherein the micro-cavity is either a micro-disk or a micro-ring.

Example 9 includes the system of any of Examples 1-8, wherein the electronic locking loop comprises a Pound-Drever-Hall locking loop.

Example 10 includes the system of any of Examples 1-9, wherein the electronic locking loop electronically locks the laser source to the resonant frequency by injection-current induced electro-optical effect.

Example 11 includes a method of stabilizing a laser comprising optically locking the laser to a resonant frequency of a micro-cavity using an optical locking loop; electronically locking the laser to the resonant frequency of a micro-cavity using an electronic locking loop; and stabilizing the resonant frequency of the micro-cavity to a reference frequency using a micro-cavity stabilization loop.

Example 12 includes the method of Example 11, wherein stabilizing the resonant frequency of the micro-cavity includes adjusting an optical path of the micro-cavity cavity based on an error signal received from an absorption line measurement of a laser beam from the micro-cavity.

Example 13 includes the method of any of Examples 11-12, wherein stabilizing the resonant frequency of the micro-cavity includes passing a laser beam from the micro-cavity through a gas chamber having an absorption line; detecting the intensity of the laser beam from the micro-cavity after it is passed through the gas chamber having the absorption line; and adjusting an optical path of the micro-cavity using a thermal phase modulator based on the intensity of the laser beam after it is passed through the gas chamber having the absorption line.

Example 14 includes the method of any of Examples 11-13, wherein optically locking the laser to the resonant frequency further comprises optically modulating the phase of the laser in a self-injection locking loop.

Example 15 includes the method of any of Examples 11-14, wherein electronically locking the laser to the resonant frequency further comprises electronically modulating the direct current in a Pound-Drever-Hall locking loop.

Example 16 includes the method of any of Examples 11-15, wherein stabilizing the resonant frequency of the micro-cavity to a reference frequency using a micro-cavity stabilization loop comprises thermally stabilizing the micro-cavity against thermal noise.

Example 17 includes a fiber optic gyroscope comprising a fiber optic coil; and a micro-cavity frequency stabilized laser system coupled to the fiber optic coil, the micro-cavity frequency stabilized laser system comprising a laser source having a first end and a second end; a first waveguide portion having a first end and a second end, the first end of the first waveguide portion coupled to the first end of the laser source; a second waveguide portion having a first end and a second end, the first end of the second waveguide portion coupled to the second end of the laser source; a micro-cavity coupled between the second end of the first waveguide portion and the second end of the second waveguide portion, the micro-cavity having a resonant frequency; an electronic locking loop coupled between the micro-cavity and the laser source, wherein the electronic locking loop electronically locks the laser source to the resonant frequency of micro-cavity; wherein the first waveguide portion is an optical locking loop coupled between the micro-cavity and the laser source, wherein the optical locking loop optically locks the laser source to the resonant frequency of the micro-cavity; a micro-cavity stabilization loop coupled with the micro-cavity, wherein the micro-cavity stabilization loop stabilizes the resonant frequency of the micro-cavity to a reference frequency; and an output for outputting light from the laser stabilization system.

Example 18 includes the fiber optic gyroscope of Example 17, wherein the micro-cavity stabilization loop includes a thermal phase modulator coupled to the micro-cavity, wherein the thermal phase modulator receives a feedback signal that varies based on an absorption line measurement of a laser beam emitted from the micro-cavity.

Example 19 includes the fiber optic gyroscope of any of Examples 17-18, wherein the electronic locking loop comprises a Pound-Drever-Hall locking loop.

Example 20 includes the fiber optic gyroscope of any of Examples 17-19, wherein the electronic locking loop electronically locks the laser source to the resonant frequency by injection-current induced electro-optical effect.

What is claimed is:

1. A laser stabilization system comprising:
    a laser source having a first end and a second end;
    a first waveguide portion having a first end and a second end, the first end of the first waveguide portion coupled to the first end of the laser source;
    a second waveguide portion having a first end and a second end, the first end of the second waveguide portion coupled to the second end of the laser source;
    a micro-cavity coupled between the second end of the first waveguide portion and the second end of the second waveguide portion, the micro-cavity having a resonant frequency;
    an electronic locking loop coupled between the micro-cavity and the laser source, wherein the electronic locking loop electronically locks the laser source to the resonant frequency of the micro-cavity;
    wherein the first waveguide portion is an optical locking loop coupled between the micro-cavity and the laser source, wherein the optical locking loop optically locks the laser source to the resonant frequency of the micro-cavity;

a micro-cavity stabilization loop coupled with the micro-cavity, wherein the micro-cavity stabilization loop stabilizes the resonant frequency of the micro-cavity to a reference frequency; and an output for outputting light from the laser stabilization system.

2. The system of claim 1, wherein the micro-cavity stabilization loop includes a thermal phase modulator coupled to the micro-cavity, wherein the thermal phase modulator receives a feedback signal that varies based on an absorption line measurement of a laser beam emitted from the micro-cavity through a gas chamber.

3. The system of claim 2, wherein the micro-cavity stabilization loop further includes:

a gas chamber having an absorption line coupled to the micro-cavity; and a photo detector coupled to the gas chamber;

wherein the photo detector measures the intensity of the laser beam emitted from the micro-cavity after it passes through the gas chamber;

wherein the feedback signal varies based on the intensity; and wherein change in the intensity is indicative of a change in the resonant frequency of the micro-cavity.

4. The system of claim 1, wherein the micro-cavity stabilization loop thermally stabilizes the micro-cavity against thermal noise.

5. The system of claim 1, wherein the laser source is a single frequency laser.

6. The system of claim 5, wherein the laser source is a multi-electrode distributed-feedback laser.

7. The system of claim 1, wherein the micro-cavity is a passive micro-ring cavity with a quality factor (Q) of above approximately 10^7.

8. The system of claim 1, wherein the micro-cavity is either a micro-disk or a micro-ring.

9. The system of claim 1, wherein the electronic locking loop comprises a Pound-Drever-Hall locking loop.

10. The system of claim 1, wherein the electronic locking loop electronically locks the laser source to the resonant frequency by injection-current induced electro-optical effect.

11. A method of stabilizing a laser comprising:

optically locking the laser to a resonant frequency of a micro-cavity using an optical locking loop;

electronically locking the laser to the resonant frequency of a micro-cavity using an electronic locking loop; and stabilizing the resonant frequency of the micro-cavity to a reference frequency using a micro-cavity stabilization loop.

12. The method of claim 11, wherein stabilizing the resonant frequency of the micro-cavity includes adjusting an optical path of the micro-cavity cavity based on an error signal received from an absorption line measurement of a laser beam from the micro-cavity.

13. The method of claim 11, wherein stabilizing the resonant frequency of the micro-cavity includes:

passing a laser beam from the micro-cavity through a gas chamber having an absorption line;

detecting the intensity of the laser beam from the micro-cavity after it is passed through the gas chamber having the absorption line; and adjusting an optical path of the micro-cavity using a thermal phase modulator based on the intensity of the laser beam after it is passed through the gas chamber having the absorption line.

14. The method of claim 11, wherein optically locking the laser to the resonant frequency further comprises:

optically modulating the phase of the laser in a self-injection locking loop.

15. The method of claim 11, wherein electronically locking the laser to the resonant frequency further comprises:

electronically modulating the direct current in a Pound-Drever-Hall locking loop.

16. The method of claim 11, wherein stabilizing the resonant frequency of the micro-cavity to a reference frequency using a micro-cavity stabilization loop comprises:

thermally stabilizing the micro-cavity against thermal noise.

17. A fiber optic gyroscope comprising:

a fiber optic coil; and a micro-cavity frequency stabilized laser system coupled to the fiber optic coil, the micro-cavity frequency stabilized laser system comprising:

a laser source having a first end and a second end;

a first waveguide portion having a first end and a second end, the first end of the first waveguide portion coupled to the first end of the laser source;

a second waveguide portion having a first end and a second end, the first end of the second waveguide portion coupled to the second end of the laser source;

a micro-cavity coupled between the second end of the first waveguide portion and the second end of the second waveguide portion, the micro-cavity having a resonant frequency;

an electronic locking loop coupled between the micro-cavity and the laser source, wherein the electronic locking loop electronically locks the laser source to the resonant frequency of micro-cavity;

wherein the first waveguide portion is an optical locking loop coupled between the micro-cavity and the laser source, wherein the optical locking loop optically locks the laser source to the resonant frequency of the micro-cavity;

a micro-cavity stabilization loop coupled with the micro-cavity, wherein the micro-cavity stabilization loop stabilizes the resonant frequency of the micro-cavity to a reference frequency; and an output for outputting light from the laser stabilization system.

18. The gyroscope of claim 17, wherein the micro-cavity stabilization loop includes a thermal phase modulator coupled to the micro-cavity, wherein the thermal phase modulator receives a feedback signal that varies based on an absorption line measurement of a laser beam emitted from the micro-cavity.

19. The gyroscope of claim 17, wherein the electronic locking loop comprises a Pound-Drever-Hall locking loop.

20. The gyroscope of claim 17, wherein the electronic locking loop electronically locks the laser source to the resonant frequency by injection-current induced electro-optical effect.

* * * * *